United States Patent
Cairoli et al.

(10) Patent No.: US 11,469,757 B2
(45) Date of Patent: Oct. 11, 2022

(54) SOLID-STATE POWER SWITCH

(71) Applicant: ABB Schweiz AG, Baden (CH)

(72) Inventors: Pietro Cairoli, Cary, NC (US); Eddy Aeloiza, Apex, NC (US); Xiaoqing Song, Apex, NC (US)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 17/072,470

(22) Filed: Oct. 16, 2020

(65) Prior Publication Data

US 2022/0123745 A1    Apr. 21, 2022

(51) Int. Cl.
| | |
|---|---|
| *H03K 17/567* | (2006.01) |
| *H03K 17/0812* | (2006.01) |
| *H03K 17/76* | (2006.01) |

(52) U.S. Cl.
CPC ..... *H03K 17/567* (2013.01); *H03K 17/08122* (2013.01); *H03K 17/76* (2013.01)

(58) Field of Classification Search
CPC ................. H03K 17/00; H03K 17/063; H03K 17/08122; H03K 17/08142; H03K 17/567; H03K 17/6871; H03K 17/693; H03K 17/76; H03K 2217/00; H03K 2217/0036
USPC ........................................................ 327/365
See application file for complete search history.

(56) References Cited

U.S. PATENT DOCUMENTS

| | | | |
|---|---|---|---|
| 4,888,504 A | 12/1989 | Kinzer | |
| 8,422,182 B2 | 4/2013 | Boudet et al. | |
| 10,276,321 B2 | 4/2019 | Kennedy et al. | |
| 2003/0122431 A1 | 7/2003 | Lewis | |
| 2010/0219878 A1 | 9/2010 | Kihara et al. | |

(Continued)

FOREIGN PATENT DOCUMENTS

| | | |
|---|---|---|
| DE | 4313882 C1 | 8/1994 |
| EP | 0118007 A2 | 9/1984 |

(Continued)

OTHER PUBLICATIONS

E. Haugan et al., "Discrimination in Offshore and Marine DC Distribution System," 2016 IEEE 17th Workshop on Control and Modeling for Power Electronics (COMPEL), Sep. 1, 2016, 7 pp., IEEE, Piscataway, US.

(Continued)

*Primary Examiner* — Menatoallah Youssef
*Assistant Examiner* — Dave Mattison
(74) *Attorney, Agent, or Firm* — Greenberg Traurig, LLP

(57) ABSTRACT

Systems, methods, techniques and apparatuses of power switches are disclosed. One exemplary embodiment is a power switch comprising a first semiconductor device and a second semiconductor device coupled together in a first anti-series configuration between a first terminal and a second terminal; a third semiconductor device and a fourth semiconductor device coupled together in a second anti-series configuration between the first terminal and the second terminal; a controller configured to operate the power switch to simultaneously conduct a first portion of a load current from the first terminal to the second terminal by closing the first semiconductor device and the second semiconductor device, and to conduct a second portion of the load current from the first terminal to the second terminal by closing the third semiconductor device and the fourth semiconductor device.

18 Claims, 4 Drawing Sheets

(56) References Cited

U.S. PATENT DOCUMENTS

| | | | |
|---|---|---|---|
| 2010/0277006 A1 | 11/2010 | Urciuoli | |
| 2018/0359835 A1 | 12/2018 | Moorthy et al. | |
| 2019/0103742 A1 | 4/2019 | Kennedy et al. | |
| 2020/0044650 A1* | 2/2020 | Fujita | H01H 9/548 |
| 2021/0184667 A1* | 6/2021 | Hayashi | H02M 1/08 |

FOREIGN PATENT DOCUMENTS

| | | |
|---|---|---|
| EP | 0197658 A2 | 10/1986 |
| EP | 0272898 A2 | 6/1988 |
| EP | 2978129 A1 | 1/2016 |
| GB | 2294166 A | 4/1996 |
| WO | 2018018043 A1 | 1/2018 |
| WO | 2018018044 A1 | 1/2018 |

OTHER PUBLICATIONS

K. Handt et al., "Intelligent, Compact and Robust Semiconductor Circuit Breaker Based on Silicon Carbide Devices," 2008 IEEE Power Electronics Specialists Conference, Aug. 8, 2008, pp. 1586-1591, IEEE, Piscataway, US.

R. R. Boudreaux et al., "A Comparison of MOSFETs, IGBTs, and MCTs for Solid State Circuit Breakers," Proceedings of Applied Power Electronics Conference. APEC '96, Aug. 6, 2002, pp. 227-233, IEEE, Piscataway, US.

Extended European Search Report, issued by the European Patent Office, regarding corresponding patent application Serial No. EP21202481.4; dated Jun. 7, 2022; 8 pages.

India First Examination Report, issued by the Intellectual Property India, regarding corresponding patent application Serial No. 202144045077; dated Jun. 8, 2022; 6 pages.

\* cited by examiner

SOLID-STATE POWER SWITCH

BACKGROUND

The present disclosure relates generally to current interruption in power networks. A power switch may be incorporated into power networks to block the flow of current. Examples of power switches include a circuit breaker, a contactor, and a breaktor, to name but a few examples. Solid-state based power switches have a number of advantages over mechanical power switches, including a faster protection speed and reduced arc flash energy hazards. Existing solid-state power switches suffer from a number of shortcomings and disadvantages. There remain unmet needs including extending device life, reducing power losses, reducing switch control complexity, reducing cost, and reducing manufacturing complexity. For instance, using a power switch for load disconnection and reconnection requires frequent current interruption that stresses the power switch. In view of these and other shortcomings in the art, there is a significant need for the apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY OF THE DISCLOSURE

Exemplary embodiments of the disclosure include systems, methods, techniques and apparatuses for solid-state power switches are disclosed. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
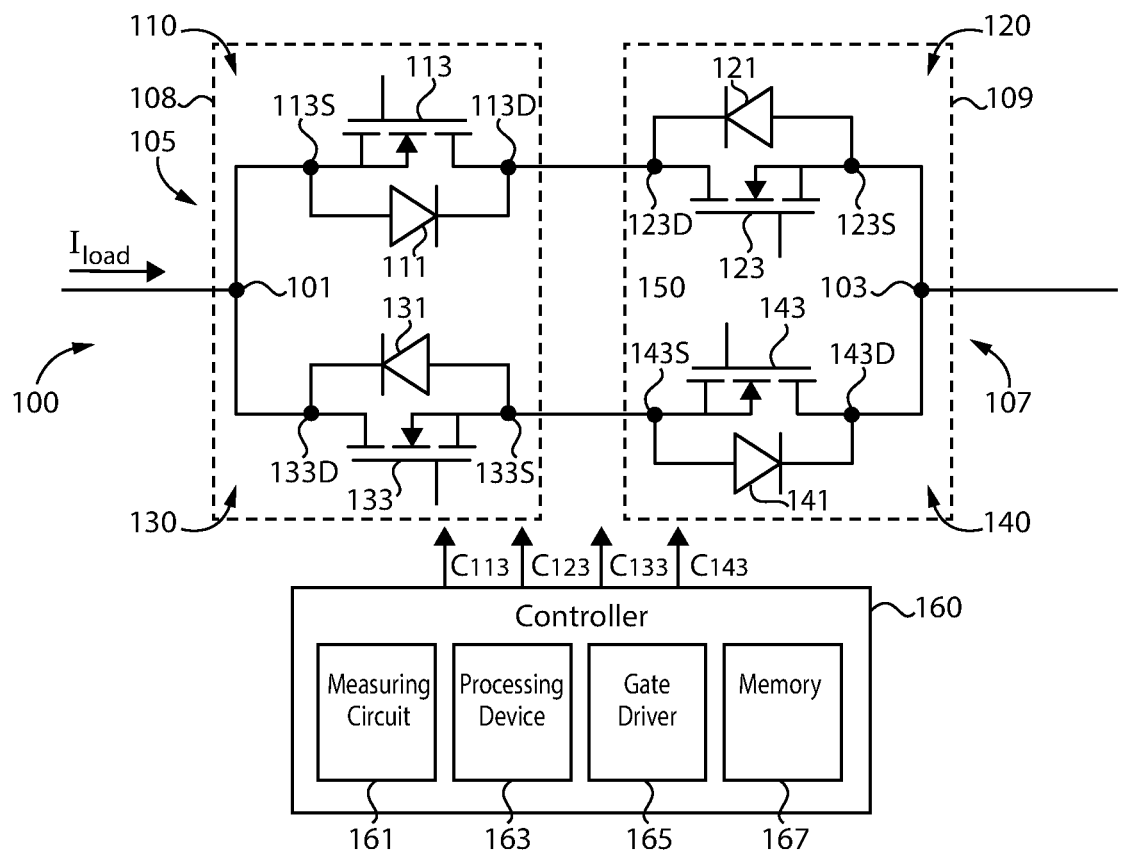
FIGS. 1-2 illustrate exemplary power switches.

With reference to FIG. 1, there is illustrated a power switch 100 is structured as a four quadrant switch, that is structured to selectively conduct bidirectional load current $I_{load}$ between power switch terminals 101 and 103, and structured to selectively block both positive and negative voltages applied to both terminals 101 and 103. It shall be appreciated that switch 100 may be implemented in a variety of applications, including circuit breakers, contactors, or a combination thereof, also known as breaktors, to name but a few examples. It shall be further appreciated that switch 100 may be incorporated into power systems structured to conduct alternating current or direct current.

Switch 100 includes two pairs of semiconductor devices coupled in opposing anti-series configurations between terminals 101 and 103. The first pair of semiconductor devices includes semiconductor device 110 and semiconductor device 120 coupled in a drain-drain configuration. Semiconductor device 110 includes a semiconductor switch 113 including a source terminal 113S coupled to terminal 101 and a drain terminal 113D coupled to semiconductor switch 123. Semiconductor device 110 also includes a diode 111 including an anode coupled to source terminal 113S and a cathode coupled to drain terminal 113D.

Semiconductor device 120 includes a semiconductor switch 123 including a source terminal 123S coupled to terminal 103 and a drain terminal 123D coupled to drain terminal 113D of semiconductor switch 113. Semiconductor device 120 also includes a diode including an anode coupled to source terminal 123S and a cathode coupled to drain terminal 123D.

The second pair of semiconductor devices includes semiconductor device 130 and semiconductor device 140 coupled in a source-source configuration. Semiconductor device 130 includes a semiconductor switch 133 including a drain terminal 133D coupled to terminal 101 and a source terminal 133S coupled to semiconductor switch 143. Semiconductor device 130 also includes a diode 131 including an anode coupled to source terminal 133S and a cathode coupled to drain terminal 133D.

Semiconductor device 140 includes a semiconductor switch 143 including a drain terminal 143D coupled to terminal 103 and a source terminal 143S coupled to source terminal 133S of semiconductor switch 133. Semiconductor device 140 also includes a diode 141 including an anode coupled to source terminal 143S and a cathode coupled to drain terminal 143D.

In certain embodiments, diodes 111, 121, 131, and 141 are intrinsic body diodes of the semiconductor switch of the same semiconductor device. In certain embodiments, one or more of diodes 111, 121, 131, and 141 are external diodes coupled in an anti-parallel configuration with the semiconductor switch of the same semiconductor device.

In the illustrated embodiment, the semiconductor switches of power switch 100 are silicon carbide (SiC) metal-oxide semiconductor field-effect transistors (MOSFETs). In other embodiments, the semiconductor switches of power switch 100 may include an insulated gate bipolar transistor (IGBT), where one pair of semiconductor switches is coupled in an emitter-emitter configuration and another pair of semiconductor switches is coupled in a collector-collector configuration. In other embodiments, the semiconductor switches of power switch 100 may include a gallium nitride (GaN) field-effect transistor (FET), a high-electron-mobility-transistor (HEMT), a SiC junction gate field-effect transistor (JFET), a GaN JFET, or a bipolar junction transistor (BJT), to name but a few examples.

In the illustrated embodiment, power switch 100 is formed using two half bridge modules 105, 107. Module 105 includes a housing 108 that encloses semiconductor switches 113 and 133, as well as diodes 111 and 131. Housing 108 includes at least three connection points, each structured to connect terminal 101, drain terminal 113D, and source terminal 133S, to an external device, such as module 105. Module 107 includes a housing 109 that encloses semiconductor switches 123 and 143, as well as diodes 121 and 141. Housing 109 includes at least three connection points each structured to couple an external device to terminal 101, drain terminal 113D, and source terminal 133S. In certain embodiments, power switch 100 is formed using a full bridge module.

In certain embodiments, power switch 100 may be assembled using standard half bridge SiC modules. Unlike customized modules used in other power switches, standard half bridge SiC modules are low cost, high volume modules, which are readily available from a number of manufacturers.

Power switch 100 includes a controller 160 structured to measure load current $I_{load}$ and operate each semiconductor device of power switch 100. Controller 160 includes a measuring circuit 161, a processing device 163, a gate driver 165, and a memory 167.

Measuring circuit 161 includes a measuring device structured to generate an output signal based on electrical characteristics of load current $I_{load}$. For example, the measuring device may include a current transformer or a current sensor structured to measure a current, to name but a few examples. Measuring circuit 161 is structured to determine a current direction based on the output signal from the measuring device. For example, measuring circuit may include a comparator structured to compare the received output signal from the measuring device and a reference voltage, and then output a current direction signal.

Gate driver 165 is structured to output control signals to each semiconductor switch. Using gate driver 165, controller 160 is structured to output a control signal $C_{113}$ to semiconductor switch 113, a control signal $C_{123}$ to semiconductor switch 123, a control signal $C_{133}$ to semiconductor switch 133, and a control signal $C_{143}$ to semiconductor switch 143. Since switches 123 and 133 are always toggled at the same time, controller 160 may be structured to output a single control signal to both switches. Likewise, since switches 113 and 143 are toggled at the same time, controller 160 may be structured to output a single control signal to both switches.

Figure 3:
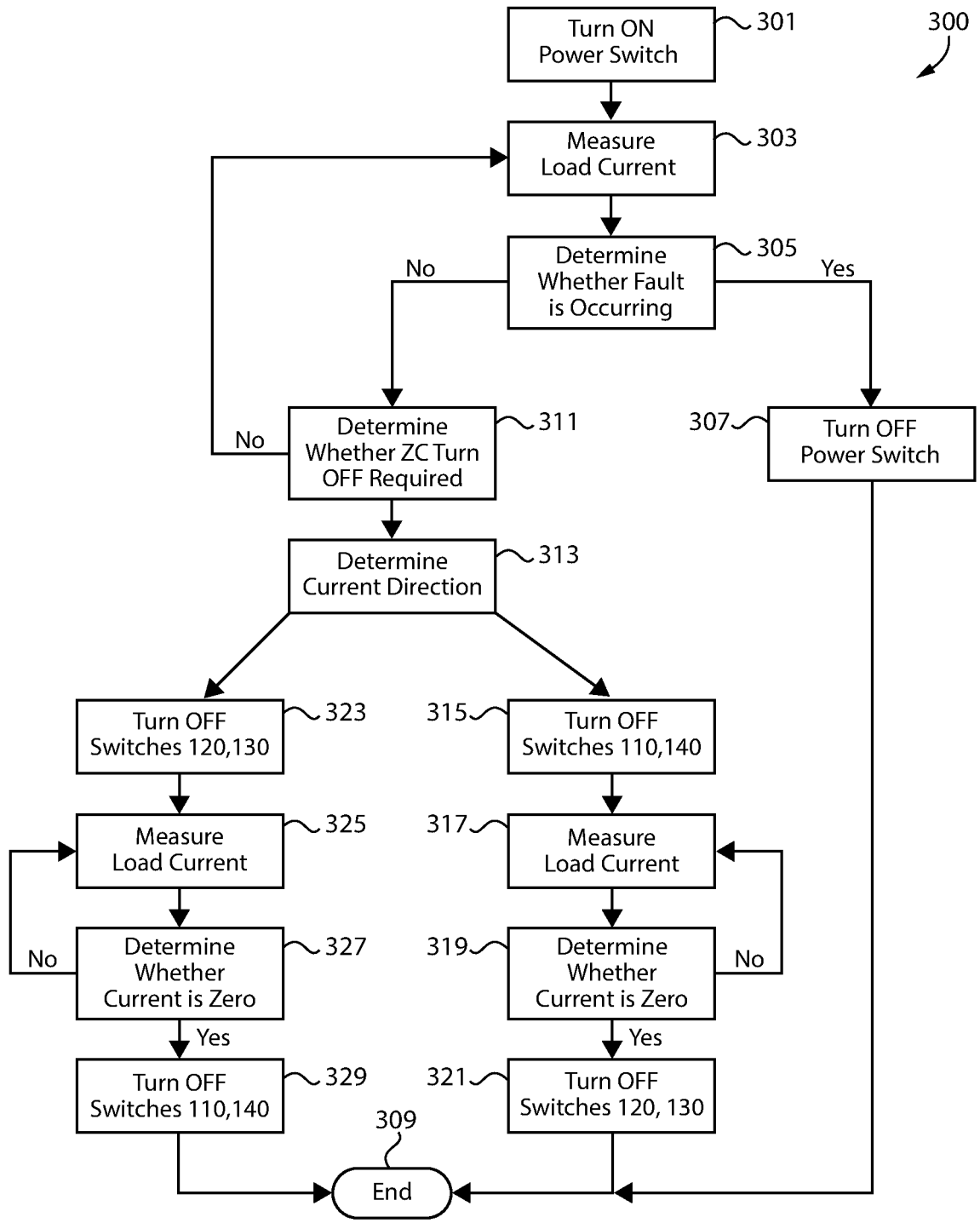
FIG. 3 is a flowchart illustrating an exemplary process for power switch control.

Processing device 163 is structured to execute a set of instructions stored by memory 167, effective to perform an exemplary power switch control process, such as the process illustrated by FIG. 3. In certain embodiments, processing device 163 and memory 167 are part of a microcontroller, to name but one example. Processing device 163 derives each control signal using an exemplary switch control process, such as the process illustrated in FIG. 3. For example, each control signal may be based on a current direction signal generated by measuring circuit 161 and may be generated in response to determining a fault is occurring or determining a zero current turn off is required, to name but a few examples.

Collectively, the control signals may be configured to conduct or block current from flowing through parallel channels including a first current channel formed by semiconductor devices 110 and 120, and a second current channel formed by semiconductor devices 130 and 140. When power switch 100 is turned on, portions of load current $I_{load}$ are simultaneously and continuously conducted through both parallel channels from terminal 101 to terminal 103. The portion of load current $I_{load}$ conducted by each channel is dependent on the impedance of the channel. Ideally, load current $I_{load}$ is shared equally by each channel. It shall be appreciated that any or all of the foregoing features of power switch 100 may also be present in the other power switches disclosed herein.

Figure 2:
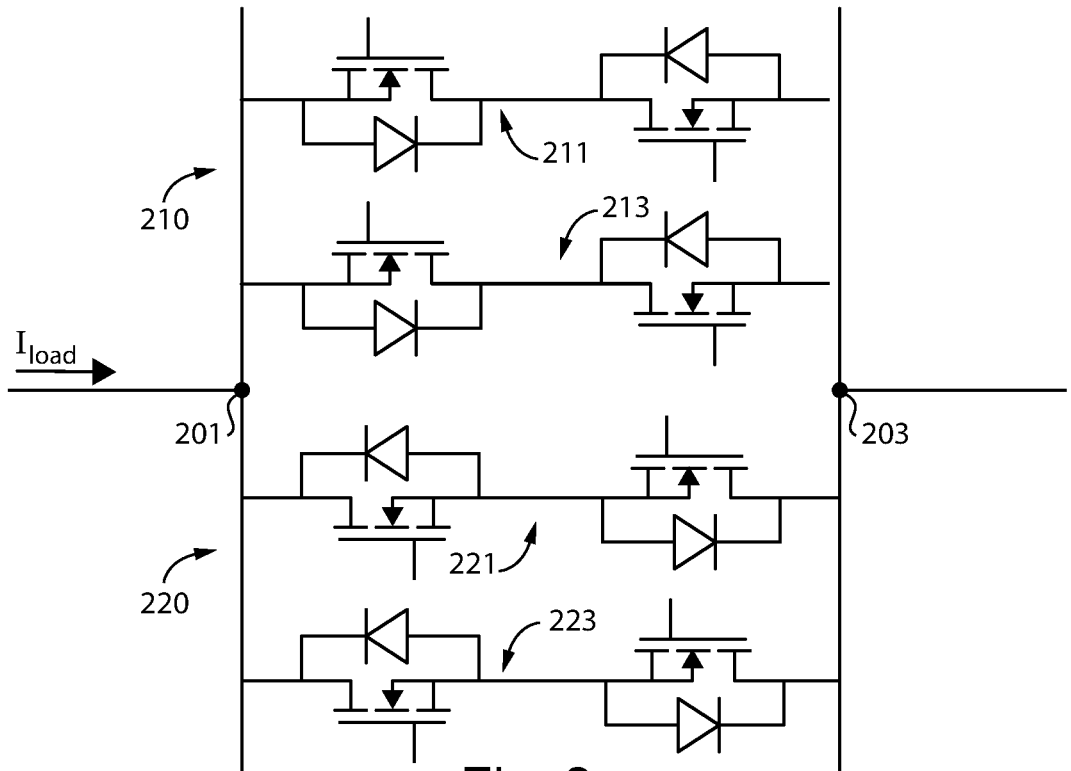

With reference to FIG. 2, there is illustrated an exemplary power switch 200 structured to selectively conduct a load current $I_{load}$ between terminals 201 and 203. Power switch 200 includes a plurality of semiconductor switch pairs 210 coupled in a first anti-series configuration and including pairs 211 and 213. Each of pairs 211 and 213 are coupled in a drain-drain configuration. Power switch 200 also includes a plurality of semiconductor switch pairs 220 coupled in a second anti-series configuration, opposite to the first anti-series configuration, and including pairs 221 and 223. Each of pairs 221 and 223 are coupled in a source-source configuration.

Since each switch pair of power switch 200 has an equal impedance when the switches are turned on, load current $I_{load}$ is divided evenly among all turned on switch pairs. As the number of parallel switch pairs increase, the current rating of the power switch 200 increases proportionally. Therefore, the number of the pluralities of semiconductor switch pairs 210 and 220 are based on a desired current rating of power switch 200. It is important to note that because the parallel switch pairs are operated in unison, passive components, such as reactors or transformers, do not need to be added to prevent a current from circulating among the parallel switch pairs.

With reference to FIG. 3, there is a flowchart illustrating an exemplary power switch control process 300. The following description of process 300 is made with reference to power switch 100 illustrated in FIG. 1. It is to be understood, however, that process 300 may be used in combination with other exemplary power switches, such as those described with reference to FIGS. 2 and 6. It shall be further appreciated that a number of variations and modifications to process 300 are contemplated including, for example, the omission of one or more aspects of process 300, the addition of further conditionals and operations and/or the reorganization or separation of operations and conditionals into separate processes.

Process 300 begins at operation 301 where controller 160 turns on power switch 100 by closing all semiconductor switches of power switch 100 effective to conduct a load current $I_{load}$ between terminals 101 and 103 through parallel current channels formed by the semiconductor switches. Controller 160 may turn on power switch 100 in response to receiving a turn-on command from a central control system, to name but one example.

Process 300 proceeds to operation 303 where controller 160 measures load current $I_{load}$. In certain embodiments, controller 160 receives a voltage from a measuring device corresponding to a load current $I_{load}$ magnitude. In certain embodiments, controller 160 receives a load current $I_{load}$ measurement from another device or measures load current $I_{load}$ using a different measuring circuit. Process 300 proceeds to operation 305 where controller 160 determines whether a fault is occurring based on the load current measurement from operation 303. The fault may be a short circuit fault or a current overload, to name but a few examples. In certain embodiments, controller 160 determines a fault is occurring by comparing a voltage corresponding to the load current $I_{load}$ magnitude with a reference voltage corresponding to a fault current threshold.

If controller 160 determines a fault is occurring, process 300 proceeds to operation 307 where controller 160 turns off power switch 100. In certain embodiments, controller 160 turns off power switch 100 by opening all the semiconductor switches of power switch 100. In certain embodiments, controller 160 turns off only the semiconductor switches needed to interrupt load current $I_{load}$. After turning off power switch 100, process 300 proceeds to end operation 309.

If controller 160 determines a fault is not occurring, process 300 proceeds to operation 311 where controller 160 determines whether a zero current turn off is required in response to determining a fault is not occurring. A zero current turn off may be used to minimize dissipated energy during frequent load connection and disconnection, thereby extending the life of power switch 100. Controller 160 may determine a zero current turn off is required based on receiving a zero current turn off command from an external device, based on an operating mode of a load receiving load current $I_{load}$, or based on a received measurement of load current $I_{load}$, to name but a few examples.

If controller 160 determines a zero current turn off is not required, process 300 returns to operation 303 and continues to monitor power switch 100 by cycling through operations 303, 305, and 311 until a fault occurs or a zero current turn off is required.

If controller 160 determines a zero current turn off is required, process 300 proceeds to operation 313 where controller 160 determines a direction of load current $I_{load}$ using measurement circuit 161. If controller 160 determines power switch 100 is conducting load current $I_{load}$ in a positive direction, that is from terminal 101 to terminal 103, process 300 proceeds to operation 315 where controller 160 turns off the semiconductor switch with corresponding diodes that will not block load current $I_{load}$ as the current flows through power switch 100 in the positive direction. For power switch 100, the controller 160 turns off semiconductor switches 113 and 143, as load current $I_{load}$ will continue to be conducted through power switch 100 by way of diodes 111 and 141.

Process 300 proceeds to operation 317 where controller 160 measures load current $I_{load}$ using measurement circuit 161. Process 300 proceeds to operation 319 where the controller determines whether load current $I_{load}$ has decreased to zero based on the measurement in operation 317. If controller 160 determines load current $I_{load}$ has not decreased to zero, process 300 returns to operation 317 and continues to monitor load current $I_{load}$ until load current $I_{load}$ has decreased to zero. In response to determining load current $I_{load}$ has decreased to zero, controller 160 proceeds to operation 321, where the remaining closed semiconductor switches of power switch 100 are opened under zero current conditions. For power switch 100, controller 160 opens switches 123 and 133. Process 300 then proceeds to end operation 309.

If controller 160 determines power switch 100 is conducting load current $I_{load}$ in a negative direction, that is from terminal 103 to terminal 101, process 300 proceeds to operation 323 where controller 160 turns off the semiconductor switches with corresponding diodes that will not block load current $I_{load}$ as the current flows through power switch 100 in the negative direction. For power switch 100, the controller 160 turns off semiconductor switches 123 and 133, as load current $I_{load}$ will continue to be conducted through power switch 100 by way of diodes 121 and 131.

Process 300 proceeds to operation 325 where controller 160 measures load current $I_{load}$ using measurement circuit 161. Process 300 proceeds to operation 327 where the controller determines whether load current $I_{load}$ has decreased to zero based on the measurement in operation 325. If controller 160 determines load current $I_{load}$ has not decreased to zero, process 300 returns to operation 325 and continues to monitor load current $I_{load}$ until load current $I_{load}$ has decreased to zero. In response to determining load current $I_{load}$ has decreased to zero, controller 160 proceeds to operation 329, where the remaining closed semiconductor switches of power switch 100 are opened under zero current conditions. For power switch 100, controller 160 opens switches 113 and 143. Process 300 then proceeds to end operation 309.

Figure 4:
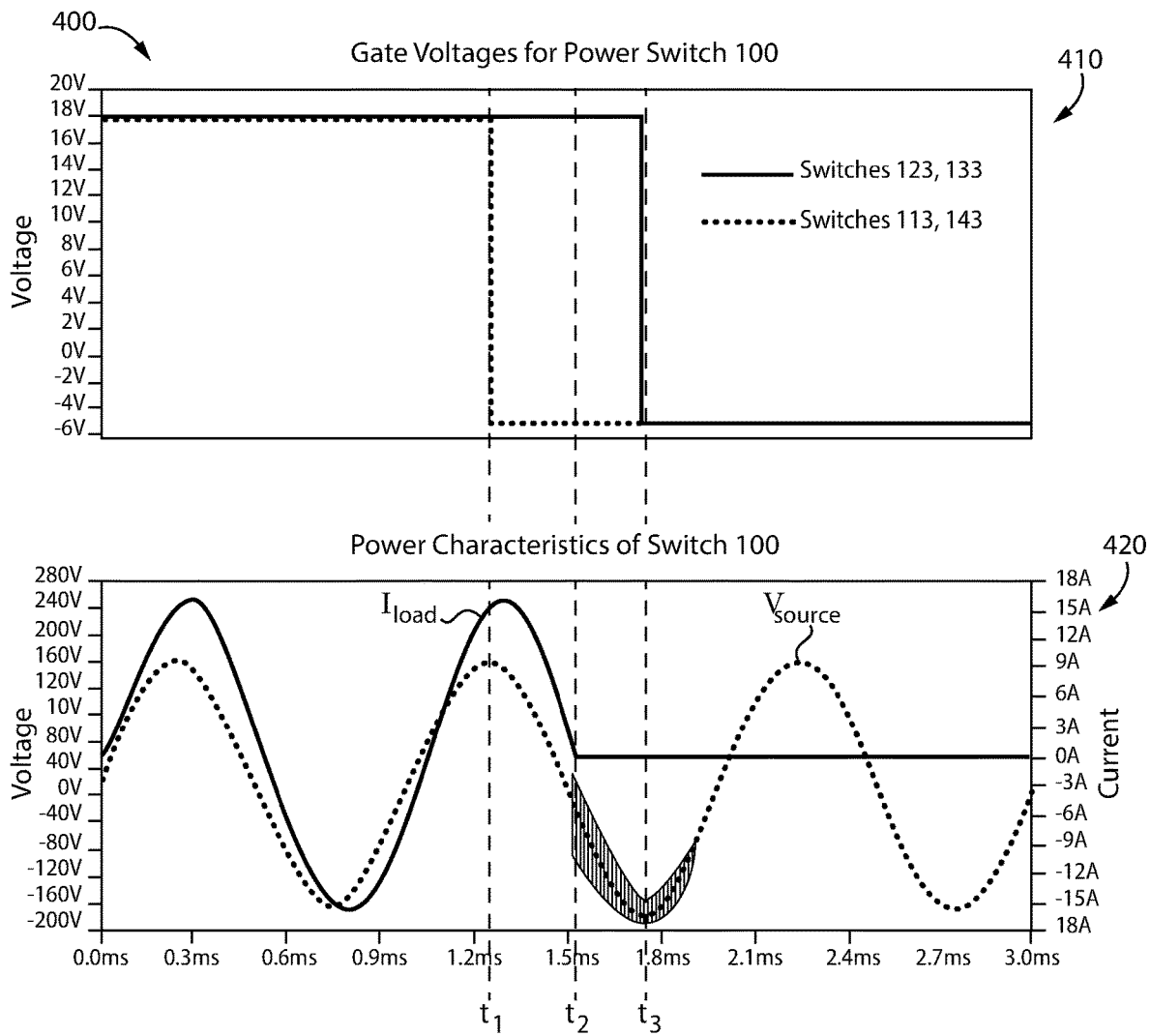
FIG. 4 is a plurality of graphs illustrating electrical characteristics of the exemplary power switch in FIG. 1.

With reference to FIG. 4, there is a plurality of graphs 400 illustrating electrical characteristics of power switch 100 during a zero current turn off. Graph 410 illustrates gate voltages applied to the semiconductor switches of power switch 100. Graph 420 illustrates load current $I_{load}$ conducted through power switch 100 and voltage $V_{source}$ received by terminal 101.

At time instant $t_1$, controller 160 turns off switches 113 and 143 in response to determining the current direction is positive. At time instant $t_2$, load current $I_{load}$ is zero. Instead of power switch 100 conducting current in a negative direction, conduction is blocked by semiconductor devices 110 and 140, which causes voltage oscillation between terminals 101 and 103. At time $t_3$, controller 160 turns off semiconductor switches 123 and 133 under zero current conditions.

Figure 5:
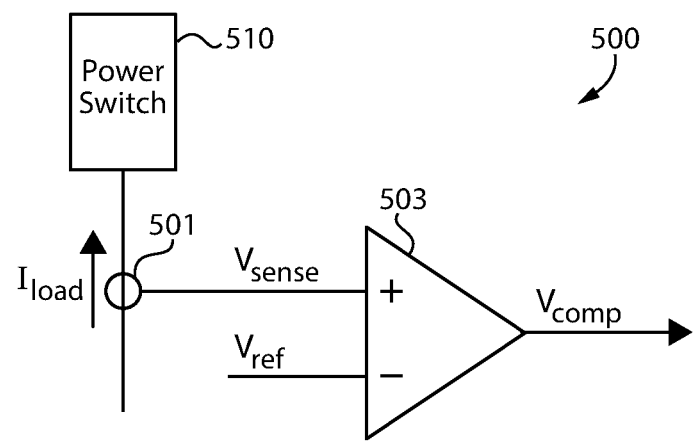
FIG. 5 illustrates an exemplary measuring circuit.

With reference to FIG. 5, there is an exemplary measuring circuit 500 of an exemplary controller structured to measure a load current $I_{load}$ conducted by an exemplary power switch 510. Circuit 500 includes a measuring device 501 structured to output a voltage $V_{sense}$ corresponding to a magnitude of load current $I_{load}$. Circuit 500 also includes a comparator 503 structured to receive voltage $V_{sense}$ and a reference voltage $V_{ref}$, and output a voltage $V_{comp}$ which may correspond to a load current direction.

Figure 6:
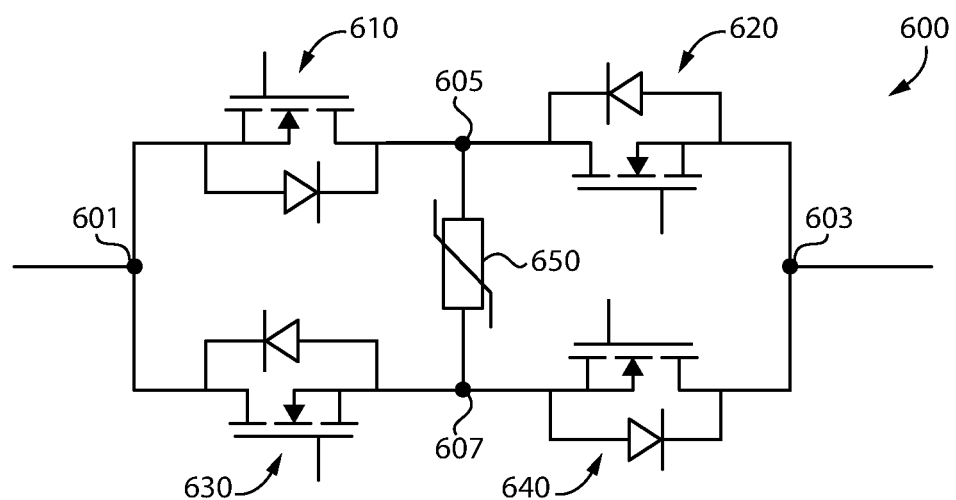
FIG. 6 illustrates another exemplary power switch.

With reference to FIG. 6, there is a circuit diagram illustrating an exemplary power switch 600. It shall be appreciated that any or all of the foregoing features of power switches 100 and 200 in FIGS. 1-2 may also be present in power switch 600. Power switch 600 includes semiconductor devices 610 and 620 coupled between power terminals 601 and 603, and coupled together at a midpoint connection 605. Semiconductor devices 610 and 620 are arranged in an anti-series configuration. Power switch 600 also includes semiconductor devices 630 and 640 coupled between power terminals 601 and 603, and coupled together at a midpoint connection 607. Semiconductor devices 630 and 640 are arranged in another anti-series configuration.

Power switch 600 includes a voltage clamping device 650 coupled between midpoint connections 605 and 607, including a first end coupled to midpoint connection 605 and a second end coupled to midpoint connection 607. Voltage clamping device 650 is structured to clamp the voltage and absorb energy during a fault current interruption, thereby preventing damage to the semiconductor devices of power switch 600.

In the illustrated embodiment, voltage clamping device 650 is a metal oxide varistor (MOV), but in other embodiments, the MOV may instead be another device structured to suppress transient voltages. In certain embodiments, voltage clamping device 650 may be coupled between power terminals 601 and 603 instead of midpoint connections 605 and 607, though the power switch inductance is lower for the illustrated configuration. It shall be appreciated that any or all of the foregoing features of power switch 600 may also be present in the other power switches disclosed herein.

Further written description of a number of exemplary embodiments shall now be provided. One embodiment is a power switch comprising: a first semiconductor device and a second semiconductor device coupled together in a first anti-series configuration between a first terminal and a second terminal; a third semiconductor device and a fourth semiconductor device coupled together in a second anti-series configuration between the first terminal and the second terminal; and a controller configured to operate the power switch to simultaneously conduct a first portion of a load current from the first terminal to the second terminal by closing the first semiconductor device and the second semiconductor device and a second portion of the load current from the first terminal to the second terminal by closing the third semiconductor device and the fourth semiconductor device.

In certain forms of the foregoing power switch, the power switch comprises a voltage clamping device including a first end coupled between the first semiconductor device and the second semiconductor device, and a second end coupled between the third semiconductor device and the fourth semiconductor device. In certain forms, the power switch comprises a voltage clamping device coupled between the first terminal and the second terminal. In certain forms, the controller is configured to operate the power switch to block the load current from conducting between the first terminal and second terminal. In certain forms, the controller is configured to measure the load current while the controller is simultaneously conducting the first portion and second portion, and determine a fault is not occurring based on the load current measurement. In certain forms, the controller is configured to determine that a zero current turn off is required in response to determining the fault is not occurring. In certain forms, the first semiconductor device includes a first diode and the fourth semiconductor device includes a second diode, wherein the controller is structured to determine a direction of the load current in response to determining a zero current turn off is required, open the first semiconductor device and the fourth semiconductor device such that the first diode conducts the first portion of the load current and the second diode conducts the second portion of the load current, determine the load current has decreased to zero, and open the second semiconductor device and the third semiconductor device in response to determining the load current has decreased to zero. In certain forms, the power switch comprises a first power electronics module including a first housing structured to enclose the first semiconductor device and the third semiconductor device; and a second power electronics module including a second housing structured to enclose the second semiconductor device and the fourth semiconductor device. In certain forms, the first anti-series configuration is a drain-drain configuration, and the second anti-series configuration is a source-source configuration, and wherein the power switch comprises a first plurality of semiconductor pairs arranged in the first anti-series configuration and a second plurality of semiconductor pairs arranged in the second anti-series configuration.

Another exemplary embodiment is a method comprising: operating a power switch including a first semiconductor device and a second semiconductor device coupled together in a first anti-series configuration between a first terminal and a second terminal; a third semiconductor device and a fourth semiconductor device coupled together in a second anti-series configuration between the first terminal and the second terminal; receiving a load current at the first terminal; selectively conducting a first portion of the load current from the first terminal to the second terminal by way of the first semiconductor device and the second semiconductor device; and conducting a second portion of the load current from the first terminal to the second terminal by way of the third semiconductor device and the fourth semiconductor device, the second portion being conducted while the first portion is being conducted.

In certain forms of the foregoing method, the method comprises coupling a voltage clamping device to a first midpoint connection between the first semiconductor device and the second semiconductor device, and coupling the voltage clamping device to a second midpoint connection between the third semiconductor device and the fourth semiconductor device. In certain forms, the method comprises coupling a voltage clamping device between the first terminal and the second terminal. In certain forms, the method comprises measuring the load current; and determining a fault is not occurring based on the load current measurement. In certain forms, the method comprises determining a zero current turn off is required in response to determining the fault is not occurring. In certain forms, the method comprises determining a direction of the load current in response to determining the zero current turn off is required; opening the first semiconductor device and the fourth semiconductor device; conducting the first portion of the load current using a first diode of the first semiconductor device; conducting the second portion of the load current using a second diode of the fourth semiconductor device; blocking the load current using first semiconductor device and the fourth semiconductor device; and opening the second semiconductor device and the third semiconductor device in response to determining the load current has decreased to zero. In certain forms, the first anti-series configuration is a drain-drain configuration, and the second anti-series configuration is a source-source configuration, and wherein the power switch includes a first plurality of semiconductor pairs arranged in the first anti-series configuration and a second plurality of semiconductor pairs arranged in the second anti-series configuration.

A further exemplary embodiment is a power switch comprising: a plurality of current channels coupled in parallel between a first power terminal and a second power terminal, the plurality of current channels including a first current channel including a first semiconductor device pair coupled together in a first anti-series configuration, the plurality of current channels including a second current channel including a second semiconductor device pair coupled together in a second anti-series configuration; and a controller configured to operate the power switch to simultaneously conduct a first portion of a load current from the first terminal to the second terminal by closing the first semiconductor device pair, and to conduct a second portion of the load current from the first terminal to the second terminal by closing the semiconductor device pair.

In certain forms of the foregoing power switch the power switch comprises a voltage clamping device coupled to a first midpoint connection of the first semiconductor device pair and coupled to a second midpoint connection of the second semiconductor device pair. In certain forms, the power switch comprises a voltage clamping device coupled between the first power terminal and the second power terminal. In certain forms, the controller is configured to measure the load current, and determine a fault is not occurring based on the load current measurement. In certain forms, the controller is configured to determine a zero current turn off is required in response to determining the fault is not occurring. In certain forms, the first semiconductor device pair includes a first semiconductor device including a first diode and the second semiconductor device pair includes a second semiconductor device including a second diode, wherein the controller is structured to determine a direction of the load current in response to determining a zero current turn off is required, open the first semiconductor device and the second semiconductor device such that the first diode conducts the first portion of the load current and the second diode conducts the second portion of the load current, determine the load current has decreased to zero, and open a third semiconductor device of the first semiconductor device pair and a fourth semiconductor device of the second semiconductor device pair in response to determining the load current has decreased to zero. In certain forms, the power switch comprises a first half bridge module including a first housing enclosing a first semiconductor device of the first semiconductor device pair and a second semiconductor device of the second semiconductor device pair; and a second half bridge module including a second housing enclosing a third semiconductor device of the first semiconductor device pair and a fourth semiconductor device of the second semiconductor device pair. In certain forms, the first anti-series configuration is a drain-drain configuration, and the second anti-series configuration is a source-source configuration, and wherein the plurality of current channels comprises a first plurality of semiconductor device pairs arranged in the first anti-series configuration and a second plurality of semiconductor device pairs arranged in the second anti-series configuration.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include but do not require a direct coupling or connection unless expressly indicated to the contrary. When the language "at least a portion" and/or "a portion" is used, the item can include a portion and/or the entire item unless specifically stated to the contrary.

What is claimed is:

1. A power switch comprising:
    a first semiconductor device and a second semiconductor device coupled together in a first anti-series configuration between a first terminal and a second terminal;
    a third semiconductor device and a fourth semiconductor device coupled together in a second anti-series configuration between the first terminal and the second terminal;
    a voltage clamping device having a first end coupled between the first semiconductor device and the second semiconductor device, and a second end coupled between the third semiconductor device and the fourth semiconductor device; and
    a controller configured to operate the power switch to simultaneously conduct a first portion of a load current from the first terminal to the second terminal by closing the first semiconductor device and the second semiconductor device and a second portion of the load current from the first terminal to the second terminal by closing the third semiconductor device and the fourth semiconductor device.

2. The power switch of claim 1, wherein the controller is configured to operate the power switch to block the load current from conducting between the first terminal and second terminal.

3. The power switch of claim 1, wherein the controller is configured to measure the load current while the controller is simultaneously conducting the first portion and second portion, and determine a fault is not occurring based on the load current measurement.

4. The power switch of claim 3, wherein the controller is configured to determine that a zero current turn off is required in response to determining the fault is not occurring.

5. The power switch of claim 4, wherein the first semiconductor device includes a first diode and the fourth semiconductor device includes a second diode, wherein the controller is structured to determine a direction of the load current in response to determining a zero current turn off is required, open the first semiconductor device and the fourth semiconductor device such that the first diode conducts the first portion of the load current and the second diode conducts the second portion of the load current, determine the load current has decreased to zero, and open the second semiconductor device and the third semiconductor device in response to determining the load current has decreased to zero.

6. The power switch of claim 1, comprising:
    a first power electronics module including a first housing structured to enclose the first semiconductor device and the third semiconductor device; and
    a second power electronics module including a second housing structured to enclose the second semiconductor device and the fourth semiconductor device.

7. The power switch of claim 1, wherein the first anti-series configuration is a drain-drain configuration, and the second anti-series configuration is a source-source configuration, and wherein the power switch comprises a first plurality of semiconductor pairs arranged in the first anti-series configuration and a second plurality of semiconductor pairs arranged in the second anti-series configuration.

8. A method comprising:
    operating a power switch including a first semiconductor device and a second semiconductor device coupled together in a first anti-series configuration between a first terminal and a second terminal;
    a third semiconductor device and a fourth semiconductor device coupled together in a second anti-series configuration between the first terminal and the second terminal;
    coupling a voltage clamping device to a first midpoint connection between the first semiconductor device and the second semiconductor device, and
    coupling the voltage clamping device to a second midpoint connection between the third semiconductor device and the fourth semiconductor device,
    receiving a load current at the first terminal;

selectively conducting a first portion of the load current from the first terminal to the second terminal by way of the first semiconductor device and the second semiconductor device; and conducting a second portion of the load current from the first terminal to the second terminal by way of the third semiconductor device and the fourth semiconductor device, the second portion being conducted while the first portion is being conducted.

9. The method of claim 8, comprising:
measuring the load current; and
determining a fault is not occurring based on the load current measurement.

10. The method of claim 9, comprising determining a zero current turn off is required in response to determining the fault is not occurring.

11. The method of claim 10, comprising:
determining a direction of the load current in response to determining the zero current turn off is required;
opening the first semiconductor device and the fourth semiconductor device;
conducting the first portion of the load current using a first diode of the first semiconductor device;
conducting the second portion of the load current using a second diode of the fourth semiconductor device;
blocking the load current using first semiconductor device and the fourth semiconductor device; and
opening the second semiconductor device and the third semiconductor device in response to determining the load current has decreased to zero.

12. The method of claim 8, wherein the first anti-series configuration is a drain-drain configuration, and the second anti-series configuration is a source-source configuration, and wherein the power switch includes a first plurality of semiconductor pairs arranged in the first anti-series configuration and a second plurality of semiconductor pairs arranged in the second anti-series configuration.

13. A power switch comprising:
a plurality of current channels coupled in parallel between a first power terminal and a second power terminal,
the plurality of current channels including a first current channel including a first semiconductor device pair coupled together in a first anti-series configuration,
the plurality of current channels including a second current channel including a second semiconductor device pair coupled together in a second anti-series configuration;
a voltage clamping device coupled to a first midpoint connection of the first semiconductor device pair and coupled to a second midpoint connection of the second semiconductor device pair; and
a controller configured to operate the power switch to simultaneously conduct a first portion of a load current from the first terminal to the second terminal by closing the first semiconductor device pair, and
to conduct a second portion of the load current from the first terminal to the second terminal by closing the semiconductor device pair.

14. The power switch of claim 13, wherein the controller is configured to measure the load current, and determine a fault is not occurring based on the load current measurement.

15. The power switch of claim 14, wherein the controller is configured to determine a zero current turn off is required in response to determining the fault is not occurring.

16. The power switch of claim 15, wherein the first semiconductor device pair includes a first semiconductor device including a first diode and the second semiconductor device pair includes a second semiconductor device including a second diode, wherein the controller is structured to determine a direction of the load current in response to determining a zero current turn off is required, open the first semiconductor device and the second semiconductor device such that the first diode conducts the first portion of the load current and the second diode conducts the second portion of the load current, determine the load current has decreased to zero, and open a third semiconductor device of the first semiconductor device pair and a fourth semiconductor device of the second semiconductor device pair in response to determining the load current has decreased to zero.

17. The power switch of claim 13, comprising:
a first half bridge module including a first housing enclosing a first semiconductor device of the first semiconductor device pair and a second semiconductor device of the second semiconductor device pair; and
a second half bridge module including a second housing enclosing a third semiconductor device of the first semiconductor device pair and a fourth semiconductor device of the second semiconductor device pair.

18. The power switch of claim 13, wherein the first anti-series configuration is a drain-drain configuration, and the second anti-series configuration is a source-source configuration, and wherein the plurality of current channels comprises a first plurality of semiconductor device pairs arranged in the first anti-series configuration and a second plurality of semiconductor device pairs arranged in the second anti-series configuration.

* * * * *